(12) United States Patent
Li

(10) Patent No.: US 10,910,449 B2
(45) Date of Patent: Feb. 2, 2021

(54) ELECTRONIC DEVICE AND MANUFACTURING METHOD FOR SAME

(71) Applicant: GUANGDONG OPPO MOBILE TELECOMMUNICATIONS CORP., LTD., Guangdong (CN)

(72) Inventor: Jie Li, Guangdong (CN)

(73) Assignee: GUANGDONG OPPO MOBILE TELECOMMUNICATIONS CORP., LTD., Guangdong (CN)

(*) Notice: Subject to any disclaimer, the term of this patent is extended or adjusted under 35 U.S.C. 154(b) by 0 days.

(21) Appl. No.: 16/178,978

(22) Filed: Nov. 2, 2018

(65) Prior Publication Data

US 2019/0280058 A1    Sep. 12, 2019

(30) Foreign Application Priority Data

Mar. 9, 2018    (CN) .......................... 2018 1 0194405

(51) Int. Cl.
*H01L 27/32*    (2006.01)
*G01S 7/481*    (2006.01)
(Continued)

(52) U.S. Cl.
CPC ........ *H01L 27/3227* (2013.01); *G01S 7/4813* (2013.01); *G01S 17/08* (2013.01);
(Continued)

(58) Field of Classification Search
CPC ... H01L 27/3227; H01L 51/56; H01L 51/529; H01L 51/5284; H01L 51/524;
(Continued)

(56) References Cited

U.S. PATENT DOCUMENTS 8,996,082 B2 * 3/2015 Tam ........................ G01S 17/04
455/575.8
9,799,948 B2 * 10/2017 Rubin ..................... H01Q 5/22
(Continued)

FOREIGN PATENT DOCUMENTS

CN    205015864    2/2016
CN    105677110    6/2016
(Continued)

OTHER PUBLICATIONS

WIPO, English Translation of ISR/WO for PCT/2018/119478, Feb. 1, 2019.
(Continued)

*Primary Examiner* — Grant Sitta
(74) *Attorney, Agent, or Firm* — Hodgson Russ LLP

(57) ABSTRACT

An electronic device and a manufacturing method for the same are provided. The electronic device includes a light-permeable display screen and an infrared sensor. The light-permeable display screen has a first surface and a second surface. The second surface includes a display area and a black matrix area surrounding the display area. The display area includes a pixel region for displaying content with low frequency changes. The infrared sensor includes an emitter integrated in the pixel region and a receiver arranged opposite to one of the display area and the black matrix area. The emitter is configured to emit an infrared light through the first surface, and the receiver is configured to receive the infrared light through the one of the display area and the black matrix area.

11 Claims, 13 Drawing Sheets

(51) Int. Cl.
*G01S 17/08* (2006.01)
*H01L 23/552* (2006.01)
*H01L 51/52* (2006.01)
*H01L 51/56* (2006.01)
*H05K 9/00* (2006.01)
*G06F 3/041* (2006.01)
*G06F 1/16* (2006.01)
*H04M 1/02* (2006.01)

(52) U.S. Cl.
CPC ............ *G06F 3/041* (2013.01); *H01L 23/552* (2013.01); *H01L 27/323* (2013.01); *H01L 27/3244* (2013.01); *H01L 51/524* (2013.01); *H01L 51/529* (2013.01); *H01L 51/5284* (2013.01); *H01L 51/56* (2013.01); *H05K 9/0054* (2013.01); *G06F 1/1626* (2013.01); *G06F 1/1643* (2013.01); *G06F 1/1656* (2013.01); *G06F 1/1684* (2013.01); *G06F 2203/04107* (2013.01); *H01L 2227/323* (2013.01); *H04M 1/0266* (2013.01); *Y02D 30/70* (2020.08)

(58) Field of Classification Search
CPC . H01L 27/3244; H01L 27/323; H01L 23/552; H01L 2227/323; G06F 3/041; G06F 2203/04107; G06F 1/1684; G06F 1/1656; G06F 1/1643; G06F 1/1626; H05K 9/0054; G01S 17/08; G01S 7/4813; Y02D 70/00; Y02D 30/70; H04M 1/026; H04M 2250/12; H04M 2250/22; H04M 1/72569; H04M 1/23; H04M 1/0266; H04W 52/0251
See application file for complete search history.

(56) References Cited

U.S. PATENT DOCUMENTS

| | | | | |
|---|---|---|---|---|
| 9,864,039 | B2* | 1/2018 | Alameh | G01S 3/783 |
| 9,997,137 | B2* | 6/2018 | Cote | G09G 3/3225 |
| 10,360,691 | B2* | 7/2019 | Evans, V | G01N 21/01 |
| 10,422,876 | B2* | 9/2019 | Wang | G01V 8/14 |
| 10,459,548 | B2* | 10/2019 | Kim | G06F 1/1684 |
| D890,112 | S* | 7/2020 | Park | D14/138 G |
| 10,705,192 | B2* | 7/2020 | Kubacki | G01S 17/894 |
| 10,721,348 | B2* | 7/2020 | Choi | G06F 3/04886 |
| 2008/0246708 | A1* | 10/2008 | Ishiguro | G02F 1/13318 345/87 |
| 2012/0295665 | A1* | 11/2012 | Pantfoerder | G01J 1/0437 455/566 |
| 2013/0094126 | A1* | 4/2013 | Rappoport | G02B 5/208 361/679.01 |
| 2013/0094184 | A1* | 4/2013 | Lee | G02F 1/133512 362/97.1 |
| 2016/0042707 | A1* | 2/2016 | Wang | G09G 3/3266 345/214 |
| 2016/0334661 | A1* | 11/2016 | Tang | G06F 3/041 |
| 2016/0378334 | A1* | 12/2016 | Liu | G06F 1/1643 715/794 |
| 2017/0123454 | A1* | 5/2017 | Evans, V | G02F 1/1368 |
| 2017/0163778 | A1* | 6/2017 | Noma | H04M 1/03 |
| 2017/0293181 | A1* | 10/2017 | Jung | H01L 27/322 |
| 2017/0344785 | A1* | 11/2017 | Zhang | G06K 9/0004 |
| 2018/0226014 | A1* | 8/2018 | Komanduri | G02B 6/0051 |
| 2019/0006438 | A1* | 1/2019 | Wu | H01L 27/3211 |
| 2019/0041909 | A1* | 2/2019 | Pakula | G06F 1/26 |
| 2019/0363792 | A1* | 11/2019 | Tsonev | G09G 3/3208 |

FOREIGN PATENT DOCUMENTS

| | | |
|---|---|---|
| CN | 105979070 | 9/2016 |
| CN | 106843398 | 6/2017 |
| CN | 106878564 | 6/2017 |
| CN | 206294436 | 6/2017 |
| CN | 107145192 | 9/2017 |
| CN | 206490707 | 9/2017 |
| CN | 107608454 | 1/2018 |
| CN | 108494909 | 9/2018 |
| EP | 3396932 | 10/2018 |
| JP | 2007010556 | 1/2007 |
| JP | 2017049469 | 3/2017 |

OTHER PUBLICATIONS

EPO, Office Action for EP Application No. 18210354.9, dated Jun. 13, 2019.
SIPO, First Office Action for CN Application No. 201810194405.1, dated Jun. 14, 2019.

* cited by examiner

ELECTRONIC DEVICE AND MANUFACTURING METHOD FOR SAME

CROSS REFERENCE TO RELATED APPLICATION

The present application claims priority to Chinese Application No. 201810194405.1, filed with the State Intellectual Property Office of P. R. China on Mar. 9, 2018, the entire disclosure of which is incorporated herein by reference.

FIELD

The present disclosure relates to a technical field of electronic technologies, and particularly to an electronic device and a manufacturing method for the same.

BACKGROUND

With developments of mobile phone products into an era of a full-screen display, a screen-to-body ratio of a mobile phone is higher and higher, thus causing high requirements for hardware and structure technologies. Generally, an infrared sensor is arranged above a display screen of the current mobile phone. However, with a decrease of space around the display screen, the infrared sensor cannot be arranged in the original position, and thus how to provide the infrared sensor in the full-screen display has become a challenge urgent to be solved.

SUMMARY

Embodiments of a first aspect of the present disclosure provide an electronic device. The electronic device includes a housing, a light-permeable display screen, an emitter and a receiver. The light-permeable display screen is received in the housing and includes a display area and a black matrix area surrounding the display area. The display area includes a pixel region for displaying content with low frequency changes. The emitter is integrated in the pixel region. The receiver is arranged between the light-permeable display screen and the housing. The receiver is configured to communicate with the emitter.

Embodiments of a second aspect of the present disclosure provide another electronic device. The electronic device includes a light-permeable display screen and an infrared sensor. The light-permeable display screen has a first surface and a second surface facing away from the first surface. The second surface includes a display area and a black matrix area surrounding the display area. The display area includes a pixel region for displaying content with low frequency changes. The infrared sensor includes an emitter integrated in the pixel region and a receiver arranged opposite to one of the display area and the black matrix area. The emitter is configured to emit an infrared light through the first surface, and the receiver is configured to receive the infrared light through the one of the display area and the black matrix area.

Embodiments of a third aspect of the present disclosure provide a manufacturing method for an electronic device. The manufacturing method includes: providing a light-permeable display screen, the light-permeable display screen comprising a first surface and a second surface facing away from the first surface, the second surface comprising a display area and a black matrix area surrounding the display area, the display area comprising a pixel region for displaying content with low frequency changes; and providing an infrared sensor, the infrared sensor comprising an emitter integrated in the pixel region and a receiver arranged opposite to one of the display area and the black matrix area, the emitter being configured to emit an infrared light through the first surface, and the receiver being configured to receive the infrared light through the one of the display area and the black matrix area.

BRIEF DESCRIPTION OF THE DRAWINGS

The above and/or appended aspects and advantages of embodiments of the present disclosure will become apparent and more readily appreciated from the following descriptions made with reference the accompanying drawings.

DETAILED DESCRIPTION

Figure 1:
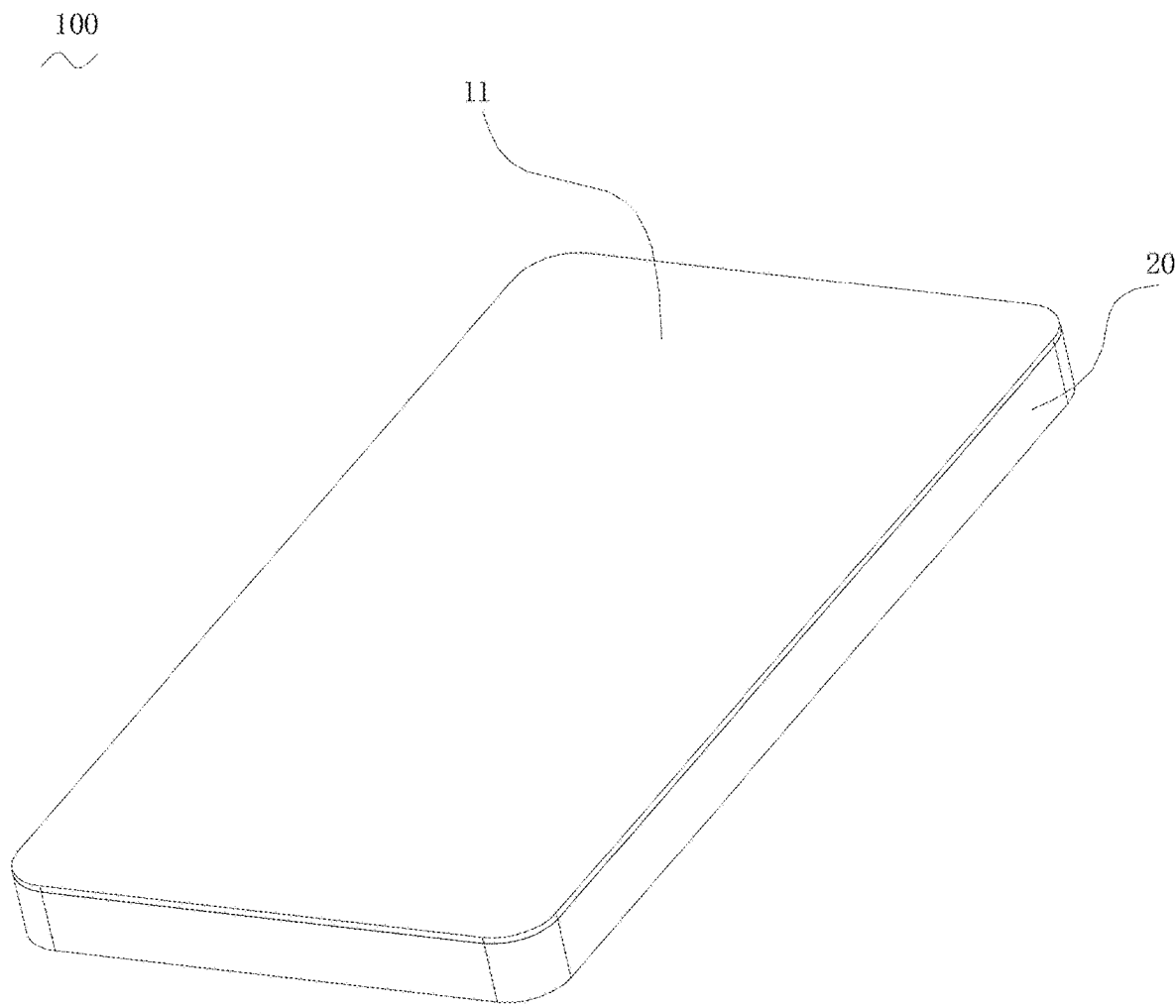
FIG. 1 is a perspective view of an electronic device according to embodiments of the present disclosure.

Embodiments of the present disclosure will be described in detail in the following. Examples of the embodiments are illustrated in the drawings. The same or similar elements and the elements having same or similar functions are denoted by like reference numerals throughout the descriptions. The embodiments described herein with reference to drawings are explanatory, and used to generally understand the present disclosure. The embodiments shall not be construed to limit the present disclosure.

An electronic device, such as a mobile phone or a tablet PC, usually is provided with an infrared sensor to detect a distance from the electronic device to a user. Taking the mobile phone as an example, the infrared sensor is arranged in an upper portion of the mobile phone. When the user has a voice call or makes related operations, the mobile phone is moved towards the user's head, the infrared sensor feeds distance information back to a processor, and the processor performs a corresponding instruction, such as turning off lights of a display screen component. In the related art, in order to arrange the infrared sensor in the electronic device, a housing of the electronic device needs to be provided with a corresponding hole for emitting and receiving an infrared light signal. However, with developments of the electronic device, people have higher and higher requirements on an appearance and an operation experience of the mobile phone. The mobile phone has been developed to have a full-screen display, and there is an ultra-narrow bezel between the display screen component and the housing of the mobile phone having the full-screen display. The ultra-narrow bezel has such a small width that the ultra-narrow bezel may not have sufficient space to be provided with the hole. Even if the ultra-narrow bezel is provided with the hole, a strength of the whole ultra-narrow bezel will be reduced, thus decreasing reliability of the electronic device.

Embodiments of the present disclosure provide an electronic device. The electronic device includes a housing, a light-permeable display screen, an emitter and a receiver. The light-permeable display screen is received in the housing and includes a display area and a black matrix area surrounding the display area. The display area includes a pixel region for displaying content with low frequency changes. The emitter is integrated in the pixel region. The receiver is arranged between the light-permeable display screen and the housing. The receiver is configured to communicate with the emitter.

Embodiments of the present disclosure provide another electronic device. The electronic device includes a light-permeable display screen and an infrared sensor. The light-permeable display screen has a first surface and a second surface facing away from the first surface. The second surface includes a display area and a black matrix area surrounding the display area. The display area includes a pixel region for displaying content with low frequency changes. The infrared sensor includes an emitter integrated in the pixel region and a receiver arranged opposite to one of the display area and the black matrix area. The emitter is configured to emit an infrared light through the first surface, and the receiver is configured to receive the infrared light through the one of the display area and the black matrix area.

As illustrated in FIGS. 1 to 4, an electronic device 100 according to embodiments of the present disclosure includes a light-permeable display screen 13, an infrared sensor 14 and a housing 20. The electronic device 100 may be the mobile phone or the tablet PC. The mobile phone is taken as an example to describe the electronic device 100 according to embodiments of the present disclosure. Certainly, the electronic device 100 may have other specific forms, which will not be defined herein.

The light-permeable display screen 13 includes a first surface 131 and a second surface 132, and the second surface 132 faces away from the first surface 131. The second surface 132 includes a display area 1321 and a black matrix area 1322, and the black matrix area 1322 surrounds the display area 1321. The light-permeable display screen 13 is configured for light-emitting display through the display area 1321 and the first surface 131. The display area 1321 includes a pixel region 1323, and the pixel region 1323 is configured to display content with low frequency changes. The infrared sensor 14 includes an emitter 141 and a receiver 142. The emitter 141 is integrated in the pixel region 1323 and emits an infrared light through the first surface 131. The receiver 142 is arranged opposite to one of the display area 1321 and the black matrix area 1322, and receives the infrared light through the one of the display area 1321 and the black matrix area 1322.

It can be understood that the first surface 131 of the light-permeable display screen 13 also includes a display area corresponding to that of the second surface 132 of the light-permeable display screen 13 and a black matrix area corresponding to that of the second surface 132 of the light-permeable display screen 13, in terms of functions.

That is, the first surface 131 may not be printed with ink at a periphery thereof, but the first surface 131 actually includes the display area and the black matrix area in functions correspondingly, due to the arrangement of the display area and the black matrix area of the second surface 132. Thus, the whole light-permeable display screen 13 includes a display area and a black matrix area extending from the first surface 131 to the second surface 132.

The pixel region 1323 is configured to display the content with low frequency changes during usage, such as the content with low frequency changes in a status bar, a signal bar and a battery bar at a top of the mobile phone as well as in a virtual button at a bottom of the mobile phone. The pixel region 1323 usually is arranged at a top or a bottom of the display area 1321. In embodiments of the present disclosure, the emitter 141 of the infrared sensor 14 is integrated with a pixel in the pixel region 1323, such that the emitted infrared light is prevented from affecting operation stability of a thin film transistor (TFT) of the display area 1321. In some embodiments, the emitter 141 may be integrated with a pixel point. When the emitter 141 operates, the corresponding pixel point will not give out light, and the emitter 141 can emit the infrared light through the first surface 131 of the light-permeable display screen 13. In other embodiments, the emitter 141 may be integrated and arranged between two adjacent pixel points. When the emitter 141 operates, the pixel point may give out light or not. It can be understood that the integrated configuration of the emitter 141 of the infrared sensor 14 and the pixel point in the pixel region 1323 may prevent the emitter 141 in operation from affecting the displaying of the light-permeable display screen 13.

The infrared sensor 14 includes the emitter 141 and the receiver 142. The emitter 141 is configured to emit the infrared light. The infrared light comes out of the pixel region 1323 and then passes through the first surface 131. When the infrared light emitted by the emitter 141 encounters an obstacle in a detection direction, a part of the infrared light will be reflected back, passes through the first surface 131 and then through the one of the display area 1321 and the black matrix area 1322, and finally is received by the receiver 142, and thus a distance from the electronic device 100 to the obstacle can be determined by a processor calculating a time of the infrared light from being emitted to being reflected back, such that a corresponding adjustment can be made. When the user makes or receives a call, the electronic device 100 is moved towards the user's head, the emitter 141 emits the infrared light, and the receiver 142 receives the infrared light reflected back from the head. After the processor calculates the time of the infrared light from being emitted to being reflected back, a corresponding instruction is generated to control the display screen to go out. When the electronic device 100 moves away from the head, the processor calculates again according to the data feedback and generates an instruction to light up the display screen again. In this way, the user's misoperations are prevented, and the battery power of the mobile phone can be saved.

In some embodiments, the emitter 141 and the receiver 142 of the infrared sensor 14 are integral. In some embodiments, when the infrared sensor 14 has an integral structure, both the emitter 141 and the receiver 142 of the infrared sensor 14 can be arranged at the pixel region 1323. That is, the emitter 141 and the receiver 142 are both aligned with at least a part of the pixel region 1323. For example, the emitter 141 is arranged in the pixel region 1323, and the receiver 142 is also arranged in the pixel region 1323. In other embodiments, the emitter 141 may be arranged in the pixel region 1323, and the receiver 142 may be arranged in the black matrix area 1322.

In addition, in other embodiments, the emitter 141 and the receiver 142 of the infrared sensor 14 may be separate. In some embodiments, when the emitter 141 and the receiver 142 are separate, the emitter 141 may be arranged in the pixel region 1323, and the receiver 142 may be arranged in or below any position in the black matrix area 1322. It can be understood that, no matter in which one of the above configurations, the emitter 141 of the infrared sensor 14 is arranged in the pixel region 1323, the infrared light emitted by the emitter 141 has few effects on the display area 1321, and the infrared light emitted by the emitter 141 is prevented from affecting the operation stability of the TFT of the display area 1321, such that the light-permeable display screen 13 and the infrared sensor 14 can achieve their functions without mutual interferences.

The housing 20 is configured to receive the light-permeable display screen 13 and the infrared sensor 14 to provide a protection function for the light-permeable display screen 13 and the infrared sensor 14. Thus, these elements are protected from direct damages resulted from external factors. The housing 20 may be formed by a computer numerical control (CNC) machine tool processing an aluminium alloy, or may be molded by injection of Polycarbonate (PC) or of PC and acrylonitrile butadiene styrene (ABS) materials.

In conclusion, in the electronic device 100 according to embodiments of the present disclosure, the light-permeable display screen 13 is used, and thus the infrared sensor 14 can be arranged below the light-permeable display screen 13 with the full-screen display. The display area 1321 of the light-permeable display screen 13 includes the pixel region 1323, and hence the emitter 141 of the infrared sensor 14 may be integrated in the pixel region 1323, such that the emitted infrared light is prevented from affecting the operation stability of the TFT of the display area 1321. Also, the receiver 142 of the infrared sensor 14 is arranged opposite to the black matrix area 1322 adjacent to the pixel region 1323, so as to stably receive the infrared light reflected back by an object, thus ensuring the stable operation of the infrared sensor 14.

In some embodiments, the light-permeable display screen 13 includes an organic light emitting diode (OLED) display screen.

In some embodiments, the OLED display screen has great transparency and allows the visible light and the infrared light to pass therethrough. Thus, the OLED display screen will not affect the infrared sensor 14 in emitting and receiving the infrared light while displaying content. The light-permeable display screen 13 may adopt a Micro light-emitting diode (LED) display screen. The Micro LED display screen also has a great light transmittance for the visible light and the infrared light. Certainly, these display screens are merely exemplary, and embodiments of the present disclosure are not limited to this.

Figure 3:
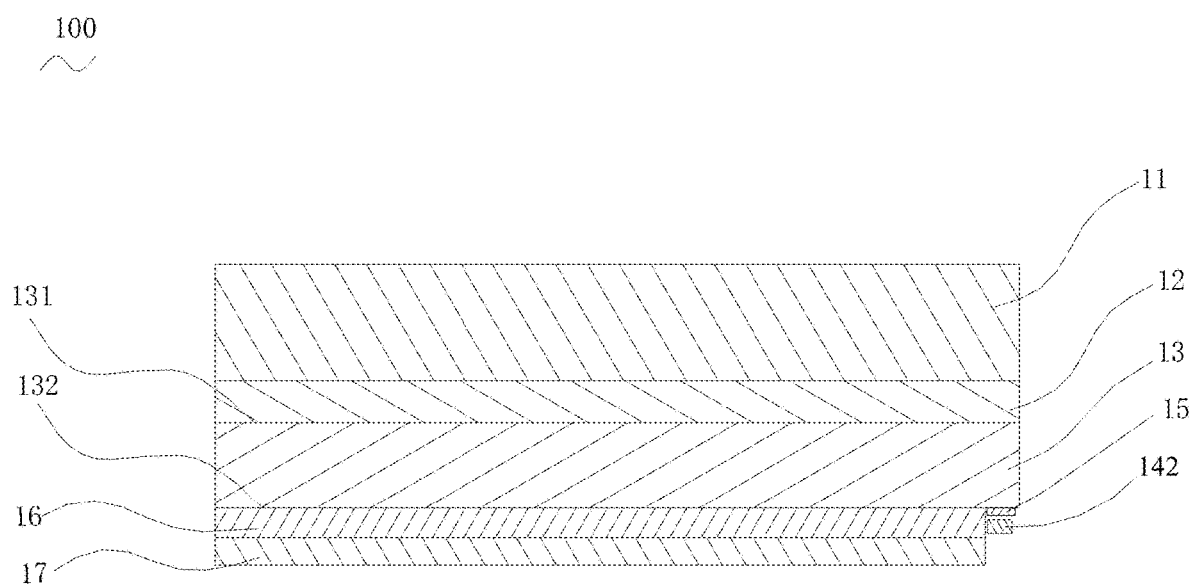
FIG. 3 is a sectional view of the light-permeable display screen in FIG. 2 along line

As illustrated in FIG. 3, in some embodiments, the electronic device 100 further includes a light-permeable touch panel 12 and a light-permeable cover plate 11. The light-permeable cover plate 11 is arranged on the light-permeable touch panel 12, the light-permeable touch panel 12 is arranged on the light-permeable display screen 13, and the first surface 131 of the light-permeable display screen 13 faces the light-permeable touch panel 12. The light-permeable touch panel 12 and the light-permeable cover plate 13 each have a light transmittance for the visible light larger than 90% and a light transmittance for the infrared light larger than 90%.

In some embodiments, the light-permeable touch panel 12 is mainly configured to receive an input signal generated when the user touches the light-permeable touch panel 12 and to transmit the input signal to the circuit board for data process, so as to obtain a specific position where the user touches the light-permeable touch panel 12. The light-permeable touch panel 12 may be laminated with the light-permeable display screen 13 by using an in-cell lamination technology or an on-cell lamination technology, thus effectively reducing a weight and a whole thickness of the display screen. In addition, since the light-permeable cover plate 11 is arranged on the light-permeable touch panel 12, the light-permeable touch panel 12 and its internal structures can be protected effectively, thus preventing the light-permeable touch panel 12 and the light-permeable display screen 13 from being damaged by an external force. The light-permeable cover plate 11 and the light-permeable touch panel 12 each have a light transmittance for the visible light larger than 90% and a light transmittance for the infrared light larger than 90%, thus facilitating the light-permeable display screen 13 to display the content better, and also facilitating the infrared sensor 14 arranged below the light-permeable display screen 13 to emit and receive the infrared light stably, thereby ensuring normal operations of the infrared sensor 14.

In some embodiments, a ratio of an area of the display area 1321 to an area of the light-permeable cover plate 11 is larger than 90%.

By setting the ratio of the area of the display area 1321 to the area of the light-permeable cover plate 11, the display area 1321 can display the content with a relatively large area size after the light-permeable display screen 13 is laminated with the light-permeable cover plate 11, thus improving the user experience, effectively increasing the screen-to-body ratio of the electronic device 100, and hence achieving the full-screen display.

Figure 2:
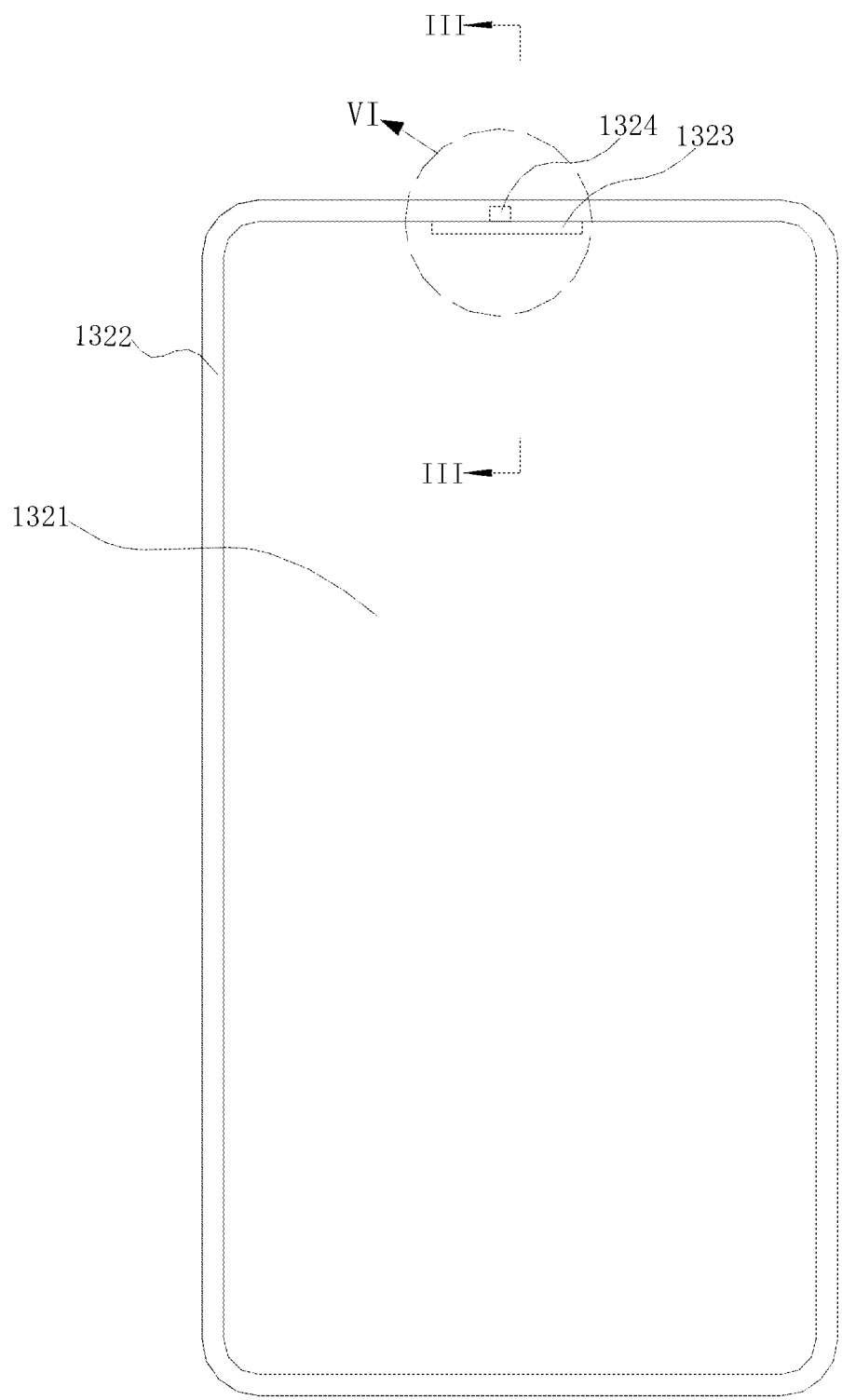
FIG. 2 is a planar view of a light-permeable display screen according to embodiments of the present disclosure.

As illustrated in FIGS. 2 and 3, in some embodiments, the black matrix area 1322 includes a window region 1324, and the receiver 142 of the infrared sensor 14 is arranged opposite to the window region 1324. In addition, in some embodiments, the electronic device 100 further includes a coating layer 15, the coating layer 15 is coated at the window region 1324 and covers the receiver 142. The coating layer 15 is configured to allow the infrared light to pass therethrough and block the visible light. The receiver 142 may receive the infrared light through the coating layer 15 and the window region 1324.

Further as illustrated in FIGS. 2 and 3, in some embodiments, the coating layer 15 includes infrared (IR) ink, the IR ink has a light transmittance for the infrared light larger than 85% and a light transmittance for the visible light less than 6%, and the IR ink allows the infrared light whose wave length ranges from 850 nm to 940 nm to pass therethrough.

Figure 5:
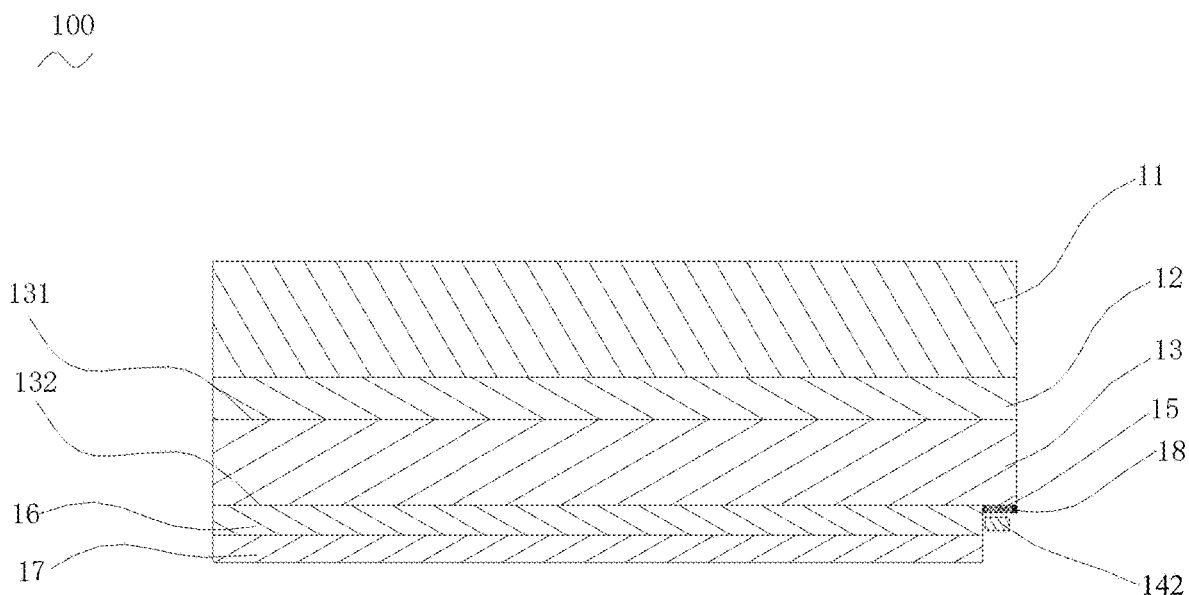
FIG. 5 is a sectional view of the electronic device in according to some embodiments of the present disclosure.

In some embodiments, the coating layer 15 is coated at the window region 1324 and covers the receiver 142, since the IR ink has a low light transmittance for the visible light, the receiver 142 arranged below the coating layer 15 cannot be saw via a visual sense based on human eyes, when the electronic device 100 is observed from outside. Also, since the IR ink further has a high light transmittance for the infrared light, the receiver 142 of the infrared sensor 14 can receive the infrared light stably, thus ensuring the normal operations of the infrared sensor 14. In addition, as illustrated in FIG. 5, in some embodiments, in order to shield other elements and wires below the display screen, the black matrix area 1322 may be coated with ink 18 which has a low light transmittance or is not light permeable, so as to ensure an appearance consistency of the electronic device 100, in which the ink 18 avoids the window region 1324.

Figure 4:
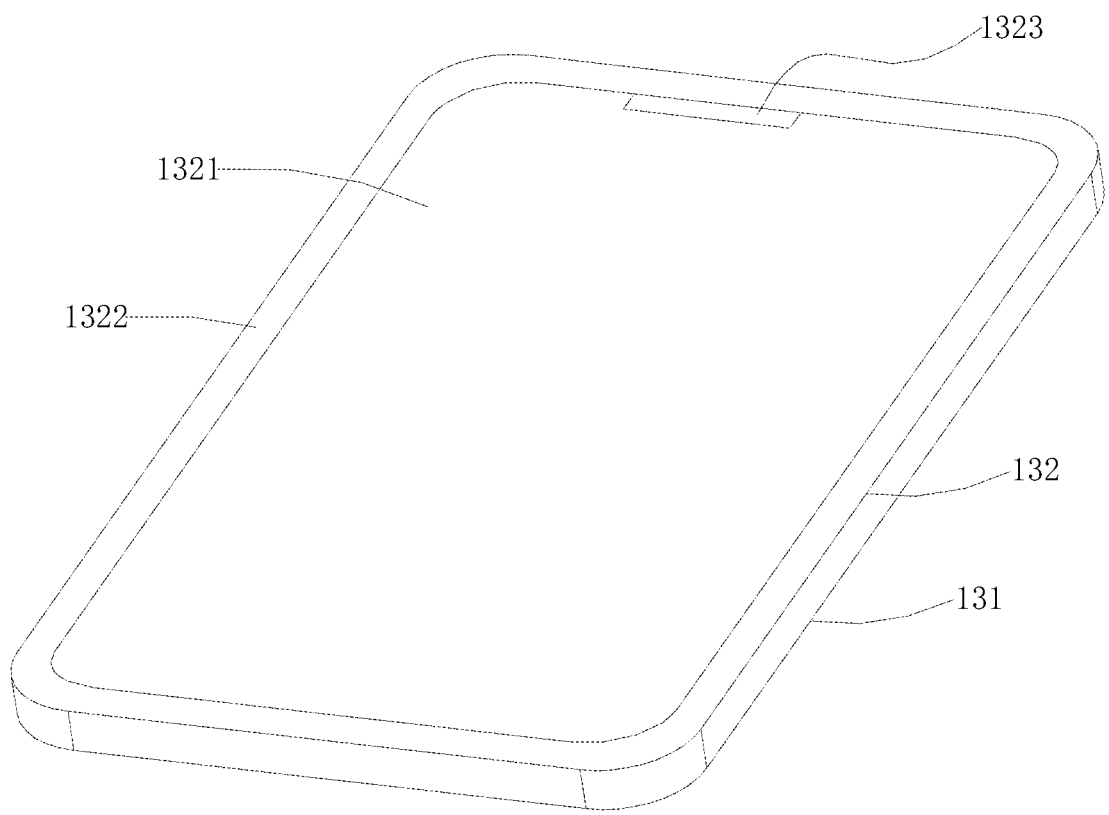
FIG. 4 is a perspective view of a light-permeable display screen according to embodiments of the present disclosure.

As illustrated in FIGS. 2 and 4, in some embodiments, the pixel region 1323 adjoins the black matrix area 1322. In this way, the emitter 141 may be arranged in the pixel region 1323, and the receiver 142 may be arranged in or below the adjacent black matrix area 1322, such that a requirement of the emitter 141 for energy can be reduced, and thus it will not be caused that the receiver 142 cannot receive the infrared light stably due to an energy decrease during transmission.

In some embodiments, the infrared sensor 14 includes a proximity sensor, and the proximity sensor includes a signal emitter and a signal receiver. The signal emitter is configured to emit the infrared light through the first surface, and the signal receiver is configured to receive the infrared light reflected by the object through the display area or the black matrix area, so as to detect the distance from the object to the electronic device 100.

In some embodiments, when the user makes or receives a call, the electronic device 100 is moved towards the user's head, the signal emitter emits the infrared light, and the signal receiver receives the infrared light reflected back. The processor calculates the time of the infrared light from being emitted to being reflected back, and generates a corresponding instruction to control the display screen to go out. When the electronic device 100 moves away from the head, the processor calculates again according to the data feedback and generates an instruction to light up the display screen again. In this way, the user's misoperations are prevented, and the battery power of the mobile phone can be saved.

Figure 6:
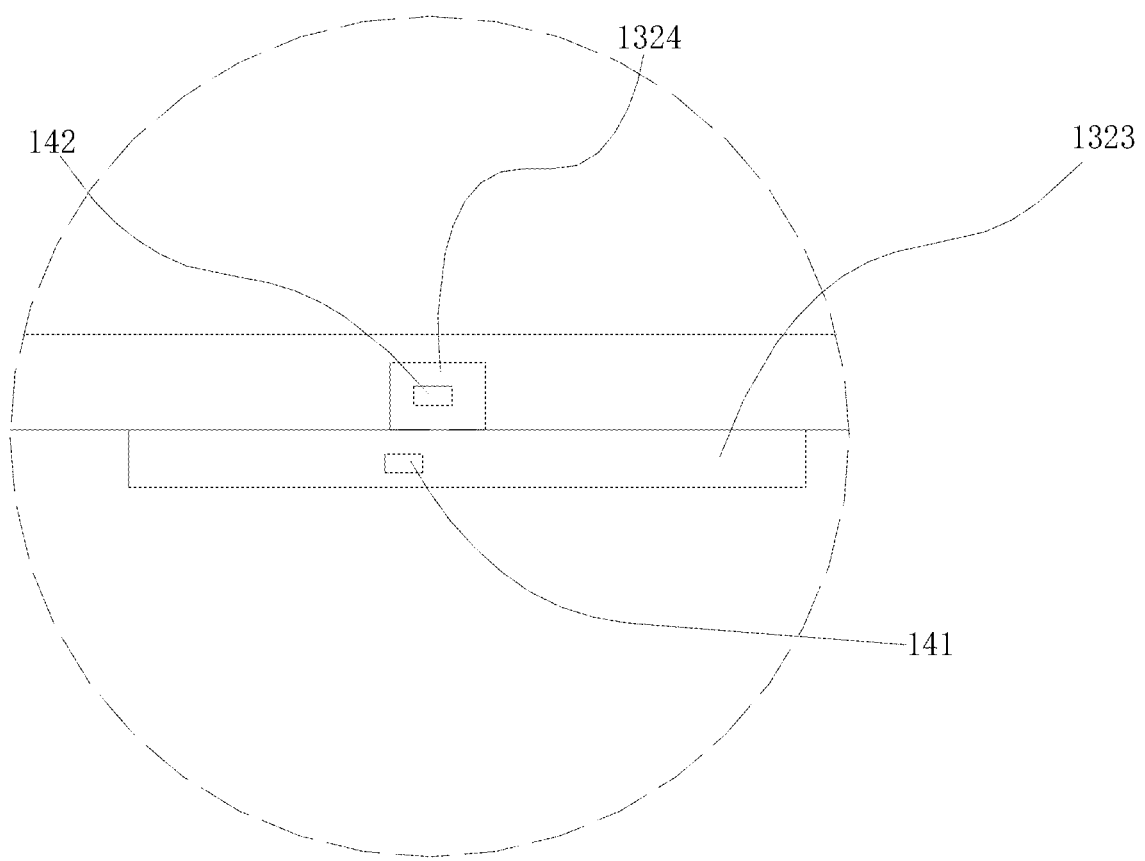
FIG. 6 to FIG. 10 are enlarged views of portion VI in FIG. 2 in some embodiments of the present disclosure.

As illustrated in FIG. 6, in some embodiments, the emitter 141 and the receiver 142 are separate.

In some embodiments, when the infrared sensor 14 has separate structures, the emitter 141 of the infrared sensor 14 may be aligned with at least a part of the pixel region 1323, for example, being arranged in the pixel region 1323, and the receiver 142 may be aligned with at least a part of the black matrix area 1322, for example being arranged in or below the black matrix area 1322. It can be understood that, when the pixel region 1323 has sufficient space to receive the emitter 141 and the receiver 142 at the same time, the emitter 141 and the receiver 142 may be arranged in the pixel region 1323 at the same time.

Figure 7:
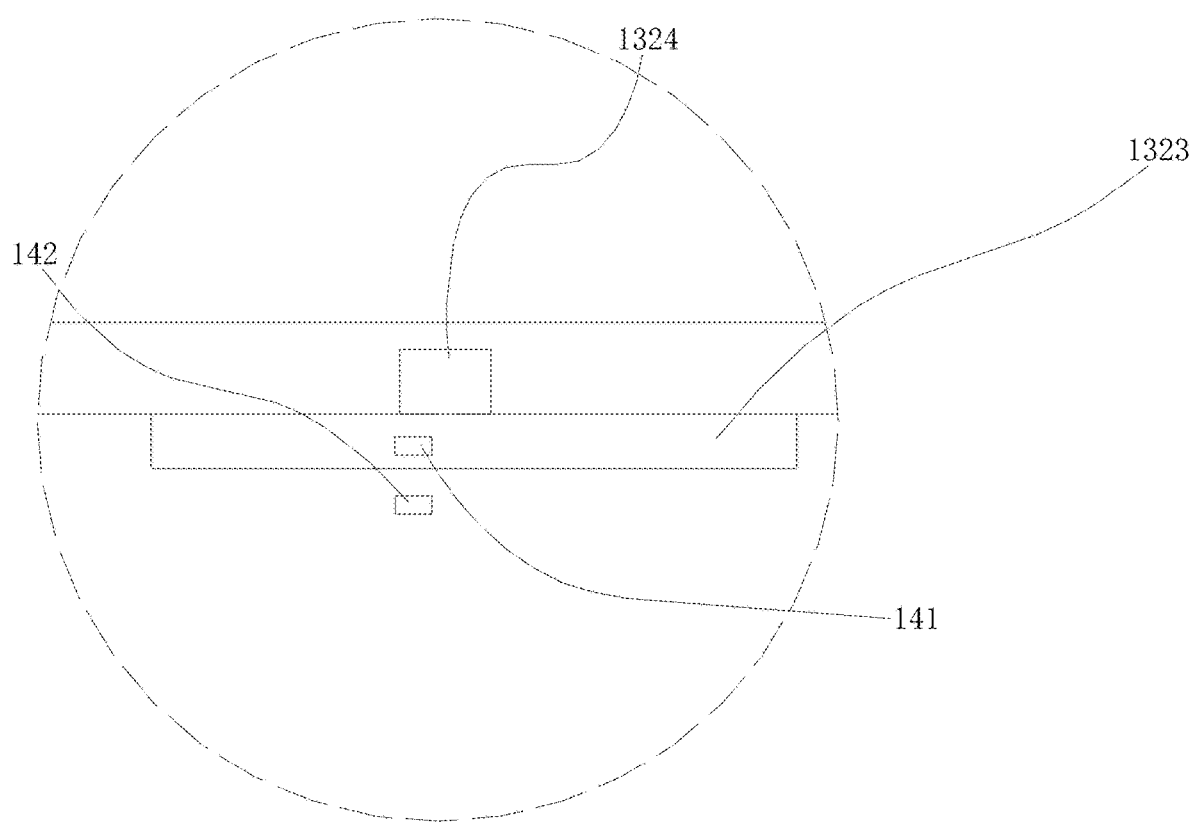

In addition, as illustrated in FIG. 7, in some embodiments, the emitter 141 of the infrared sensor 14 is aligned with a part of the pixel region 1323, for example, being arranged in the pixel region 1323, and the receiver 142 is aligned with a part of the display area 1321 except the pixel region 1323, for example, being arranged in or below the part of the display area 1321 except the pixel region 1323.

Figure 8:
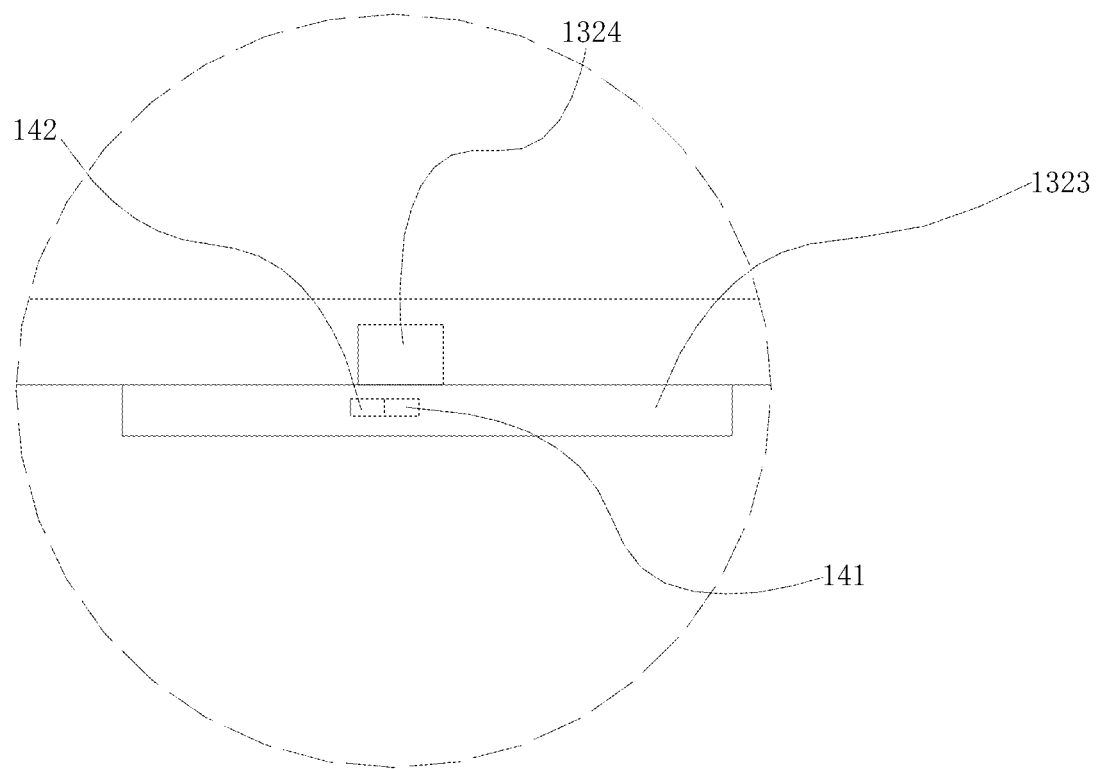

As illustrated in FIG. 8, in some embodiments, the emitter 141 and the receiver 142 are integral.

Figure 9:
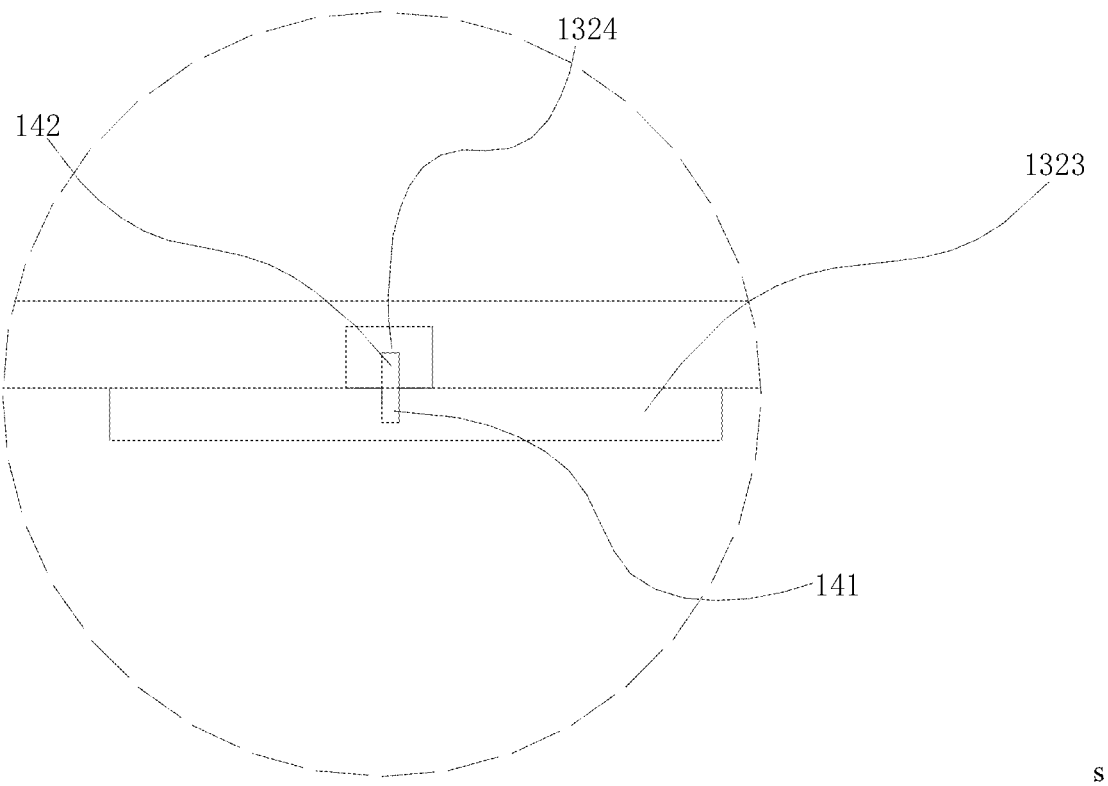
Figure 10:
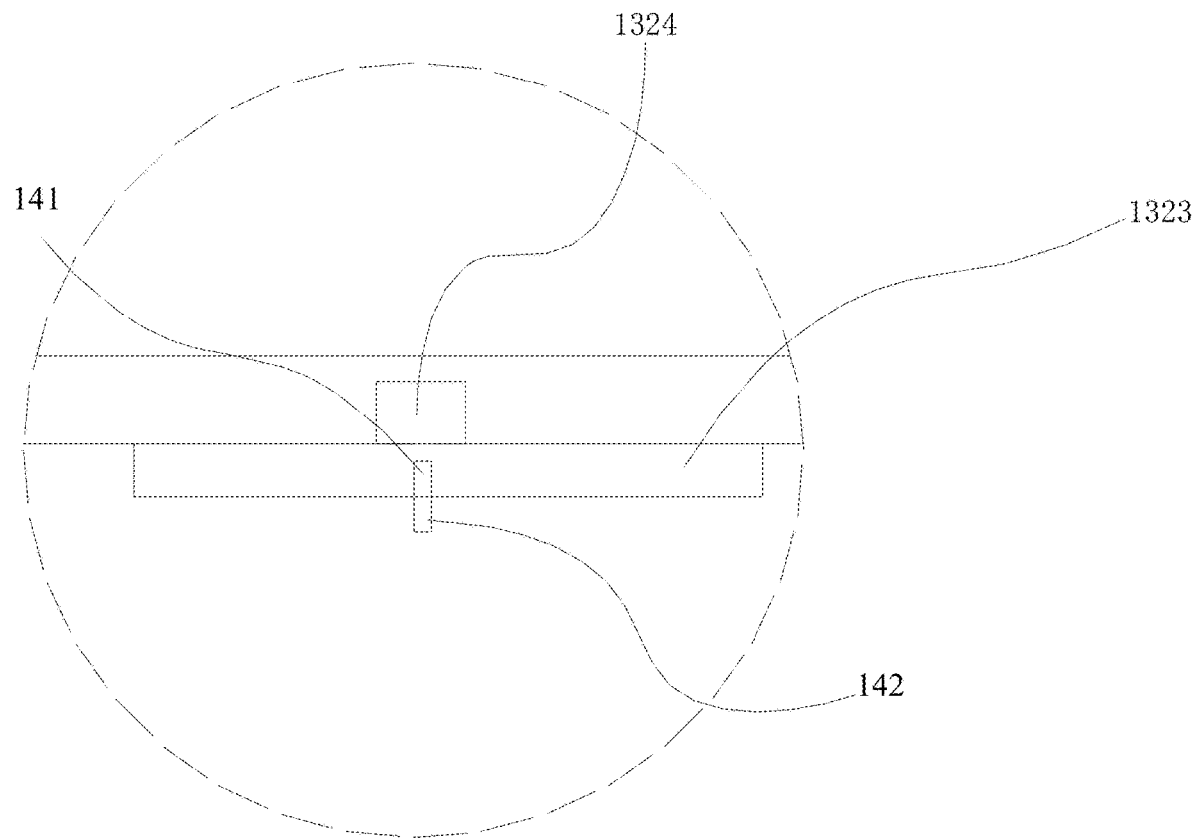

In some embodiments, when the infrared sensor 14 has an integral structure, both the emitter 141 and the receiver 142 of the infrared sensor 14 can be arranged in the pixel region 1323. In addition, as illustrated in FIG. 9, in some embodiments, the emitter 141 is aligned with a part of the pixel region 1323, for example, being arranged in the pixel region 1323, and the receiver 142 is aligned with a part of the black matrix area 1322, for example, being arranged in the black matrix area 1322. Furthermore, as illustrated in FIG. 10, in some embodiments, the emitter 141 is aligned with a part of the pixel region 1323, for example, being arranged in the pixel region 1323, and the receiver 142 is aligned with a part of the display 1321 except the pixel region 1323, for example, being arranged in the part of the display area 1321 except the pixel region 1323.

As illustrated in FIG. 5, in some embodiments, the electronic device 100 further includes a buffer layer 16 covering the second surface 132.

In some embodiments, the buffer layer 16 is configured to buffer an impact force and hence to be quakeproof, so as to protect the light-permeable touch panel 12 and the light-permeable display screen 13 as well as their internal structures, thus preventing the display screen from being damaged by an external impact effect. The buffer layer 16 may be made of foam, foamed plastics, rubber or other soft materials. Certainly, these buffer materials are merely exemplary, and embodiments of the present disclosure are not limited to this.

Further as illustrated in FIG. 5, in some embodiments, the electronic device 100 further includes a metal sheet 17 covering the buffer layer 16.

In some embodiments, the metal sheet 17 is configured for shielding electromagnetic interferences and also for grounding, and further has a function of diffusing a temperature rise.

The metal sheet 18 may be formed by cutting metal materials such as a copper foil and an aluminum foil. Certainly, these metal materials are merely exemplary, and embodiments of the present disclosure are not limited to this.

As illustrated in 11, embodiments of the present disclosure provide a manufacturing method for the electronic device 100, and the manufacturing method includes actions in following blocks.

In block S301, a light-permeable display screen 13 is provided. The light-permeable display screen 13 includes a first surface 131 and a second surface 132, and the second surface 132 faces away from the first surface 131. The second surface 132 includes a display area 1321 and a black matrix area 1322, and the black matrix area 1322 surrounds the display area 1321. The display area 1321 includes a pixel region 1323.

In block S302, an infrared sensor 14 is provided. The infrared sensor 14 includes an emitter 141 and a receiver 142. The emitter 141 is integrated in the pixel region 1323. The receiver 142 is arranged opposite to one of the display area 1321 and the black matrix area 1322. The emitter 141 emits the infrared light through the first surface 131, and the receiver 142 receives the infrared light through the one of the display area 1321 and the black matrix area 1322.

The electronic device 100 uses the light-permeable display screen 13, and thus the infrared sensor 14 can be arranged below the light-permeable display screen 13 with the full-screen display. The display area 1321 of the light-permeable display screen 13 includes the pixel region 1323, and hence the emitter 141 of the infrared sensor 14 may be integrated in the pixel region 1323, such that the emitted infrared light is prevented from affecting the operation stability of a thin film transistor (TFT) of the display area 1321. Also, the receiver 142 of the infrared sensor 14 is arranged opposite to the black matrix area 1322 adjacent to the pixel region 1323, so as to stably receive the infrared light reflected back by an object, thus ensuring the stable operation of the infrared sensor 14. The light-permeable display screen 13 may be an organic light emitting diode (OLED) display screen. The OLED display screen has great transparency and allows the visible light and the infrared light to pass therethrough. Thus, the OLED display screen will not affect the infrared sensor 14 in emitting and receiving the infrared light while displaying content. The light-permeable display screen 13 may adopt a Micro light-emitting diode (LED) display screen. The Micro LED display screen also has a great light transmittance for the visible light and the infrared light. Certainly, these display screens are merely exemplary, and embodiments of the present disclosure are not limited to this.

Figure 11:
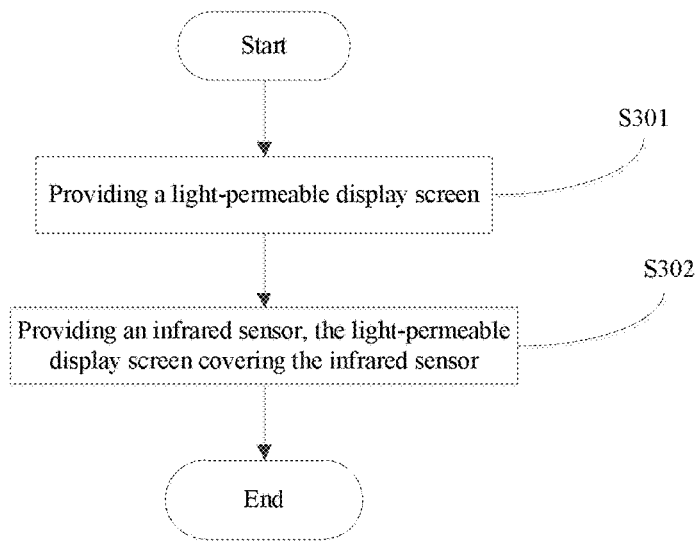
FIG. 11 is a block diagram of a manufacturing method for an electronic device in the present disclosure.
Figure 12:
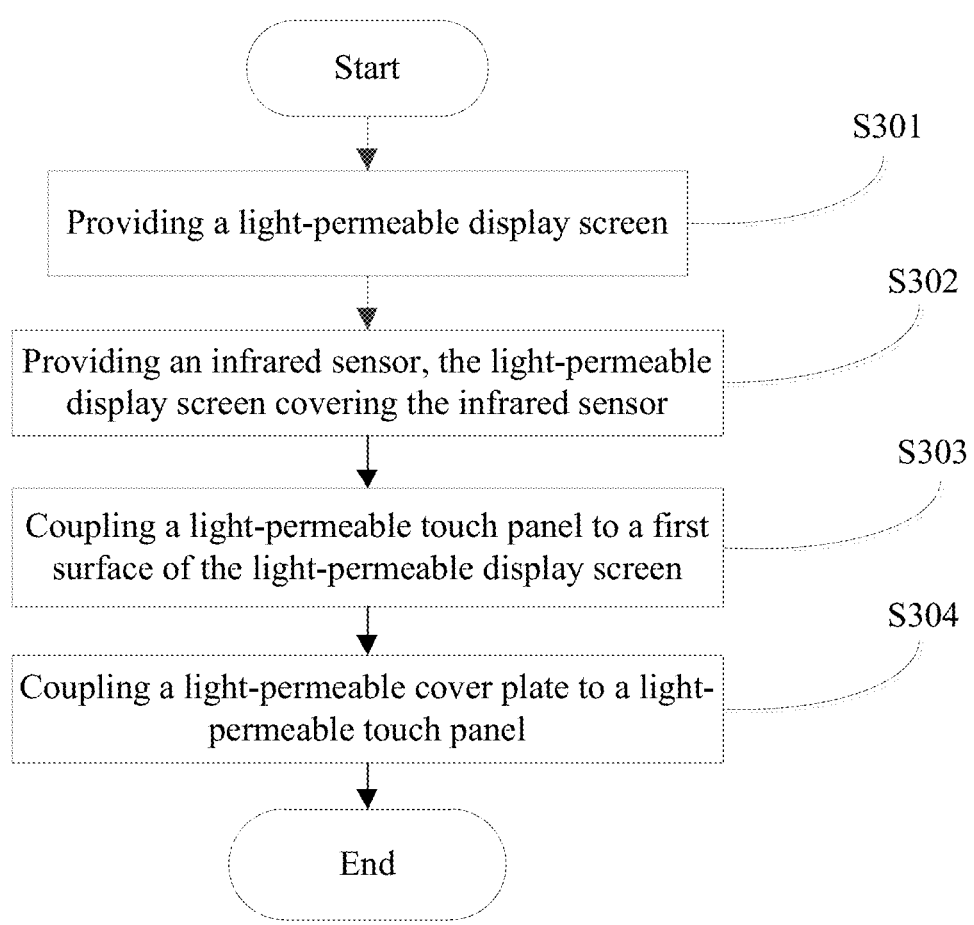
FIG. 12 to FIG. 15 are block diagrams of the manufacturing method for the electronic device according to some embodiments of the present disclosure.

As illustrated in FIG. 12, in some embodiments, the manufacturing method for the electronic device 100 further includes actions in following blocks, compared to the manufacturing method for the electronic device 100 illustrated in FIG. 11.

In block S303, a light-permeable touch panel 12 is coupled to the light-permeable display screen 13. In some embodiments, the light-permeable touch panel 12 is arranged on the first surface 131 of the light-permeable display screen 13.

In block S304, a light-permeable cover plate 11 is coupled to the light-permeable touch panel 12. In some embodiments, the light-permeable cover plate 11 is arranged on a side of the light-permeable touch panel 12 facing away from the light-permeable display screen 13.

In some embodiments, the light-permeable touch panel 12 is mainly configured to receive an input signal generated when the user touches the light-permeable touch panel 12 and to transmit the input signal to the circuit board for data process, so as to obtain a specific position where the user touches the light-permeable touch panel 12. The light-permeable touch panel 12 may be laminated with the light-permeable display screen 13 by using an in-cell lamination technology or an on-cell lamination technology, thus effectively reducing a weight and a whole thickness of the display screen. In addition, since the light-permeable cover plate 11 is arranged on the light-permeable touch panel 12, the light-permeable touch panel 12 and its internal structures can be protected effectively, thus preventing the light-permeable touch panel 12 and the light-permeable display screen 13 from being damaged by an external force.

Figure 13:
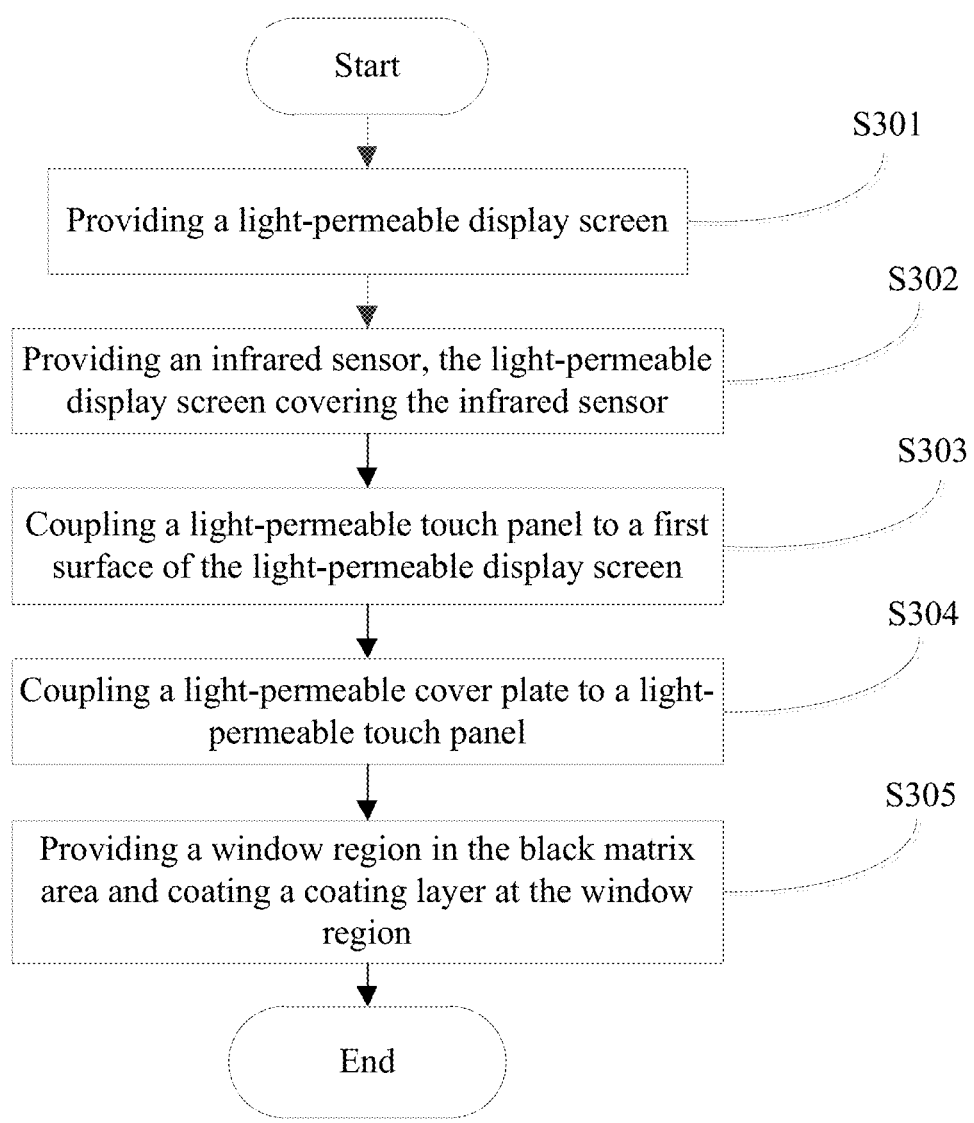

As illustrated in FIG. 13, in some embodiments, the manufacturing method for the electronic device 100 further includes an action in a following block, compared to the manufacturing method for the electronic device 100 illustrated in FIG. 12.

In block S305, a window region 1324 is provided at the black matrix area 1322, and the receiver 142 is arranged opposite to the window region 1324. The receiver 142 is configured to receive the infrared light through the window region 1324.

In addition, in some embodiments, such action in block S305 further includes an action of coating a coating layer 15 at the window region 1324. The coating layer 15 is configured to allow the infrared light to pass therethrough and block the visible light, and the receiver 142 is configured to receive the infrared light through the coating layer 15 and the window region 1324.

In some embodiments, the coating layer 15 uses an infrared (IR) ink. Since the IR ink has a low light transmittance for the visible light, the receiver 142 arranged below the coating layer 15 cannot be saw via a visual sense based on human eyes, when the electronic device 100 is observed from outside. Also, since the IR ink further has a high light transmittance for the infrared light, the receiver 142 can receive the infrared light stably, thus ensuring the normal operations of the infrared sensor 14.

Figure 14:
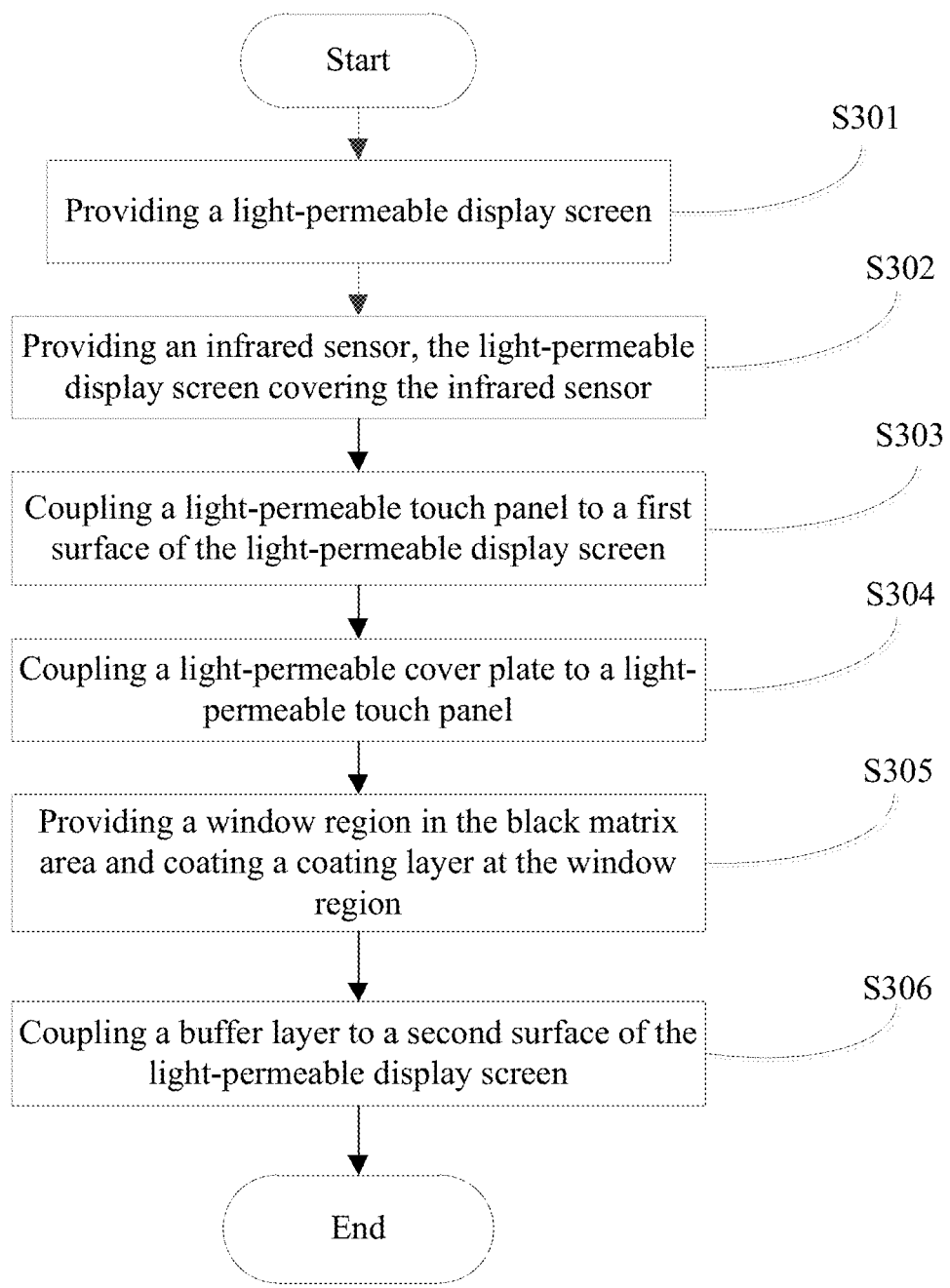

As illustrated in FIG. 14, in some embodiments, the manufacturing method for the electronic device 100 further includes an action in a following block, compared to the manufacturing method for the electronic device 100 illustrated in FIG. 13.

In block S306, a buffer layer 16 is coupled to the second surface 132 of the light-permeable display screen 13, and the buffer layer 16 covers the second surface 132.

In some embodiments, the buffer layer 16 is configured to buffer an impact force and hence to be quakeproof, so as to protect the light-permeable touch panel 12 and the light-permeable display screen 13 as well as their internal structures, thus preventing the display screen from being damaged by an external impact effect. The buffer layer 16 may be made of foam, foamed plastics, rubber or other soft materials. Certainly, these buffer materials are merely exemplary, and embodiments of the present disclosure are not limited to this.

Figure 15:
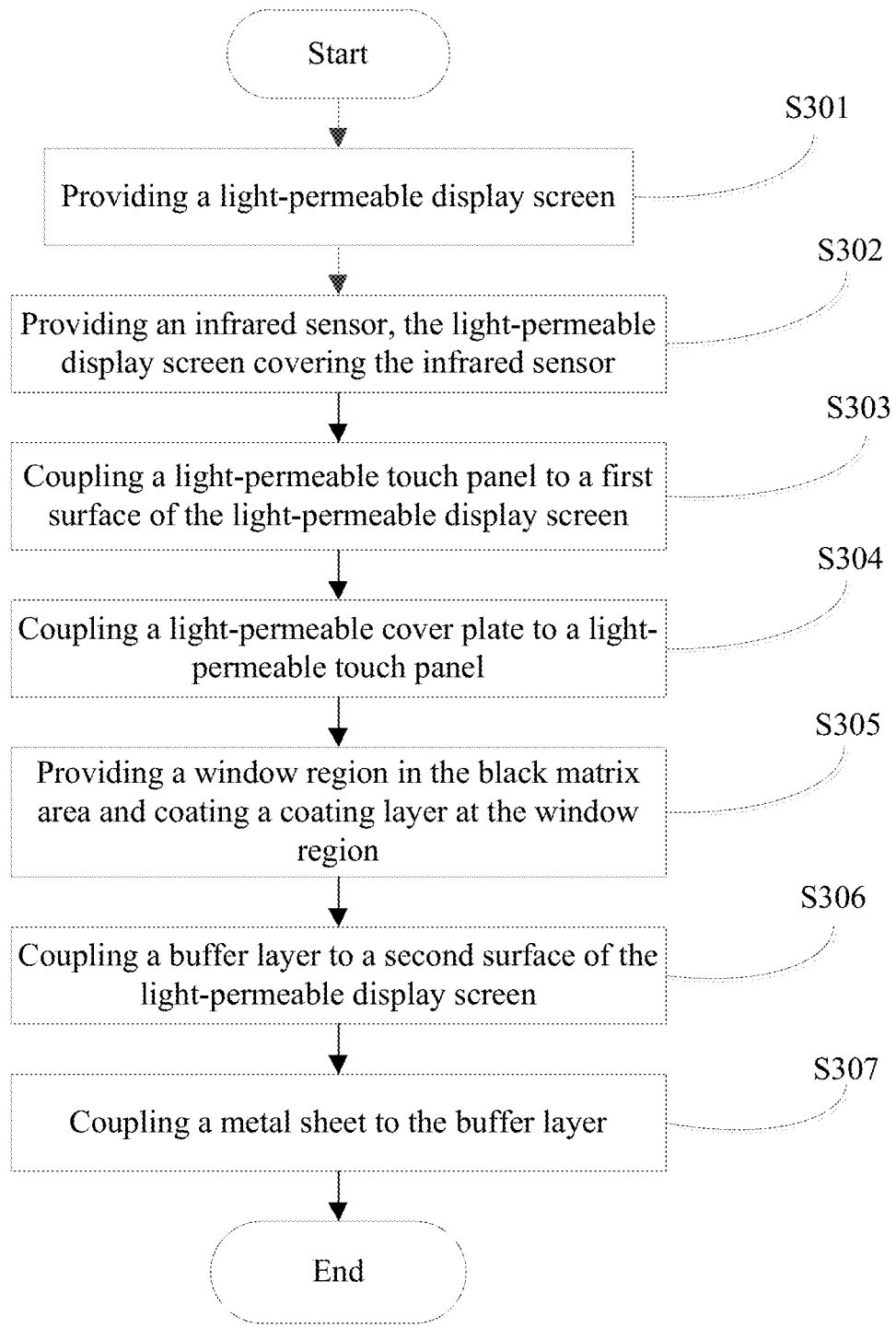

As illustrated in FIG. 15, in some embodiments, the manufacturing method for the electronic device 100 further includes an action in a following block, compared to the manufacturing method for the electronic device 100 illustrated in FIG. 14.

In block S307, a metal sheet 17 is provided below the buffer layer 16, and the metal sheet 17 covers the buffer layer 16.

In some embodiments, the metal sheet 17 is configured for shielding electromagnetic interferences and also for grounding, and further has a function of diffusing a temperature rise. The metal sheet 18 may be formed by cutting metal materials such as a copper foil and an aluminum foil. Certainly, these metal materials are merely exemplary, and embodiments of the present disclosure are not limited to this.

In the description of the present disclosure, a structure in which a first feature is "on" or "beneath" a second feature may include an embodiment in which the first feature directly contacts the second feature, and may also include an embodiment in which an additional feature is formed between the first feature and the second feature so that the first feature does not directly contact the second feature, unless otherwise specified. Furthermore, a first feature "on," "above," or "on top of" a second feature may include an embodiment in which the first feature is right "on," "above," or "on top of" the second feature, and may also include an embodiment in which the first feature is not right "on," "above," or "on top of" the second feature, or just means that the first feature has a sea level elevation larger than the sea level elevation of the second feature. While first feature "beneath," "below," or "on bottom of" a second feature may include an embodiment in which the first feature is right "beneath," "below," or "on bottom of" the second feature, and may also include an embodiment in which the first feature is not right "beneath," "below," or "on bottom of" the second feature, or just means that the first feature has a sea level elevation smaller than the sea level elevation of the second feature.

The following disclosure provides many different embodiments or examples to realize different structures of the present disclosure. To simplify the disclosure of the present disclosure, components and configurations in particular examples are elaborated. Of course, they are illustrative, and are not intended to limit the present disclosure. Moreover, reference numbers and/or letters may be repeated in different examples of the present disclosure for the purpose of simplicity and clarity, which shall not be constructed to indicate the relationships among various embodiments and/or configurations. In addition, the present disclosure provides examples of various specific processes and materials, but applicability of other processes and/or utilization of other materials are conceivable for those skilled in the art.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," and "counterclockwise," should be construed to refer to the orientation as then described or as shown in the drawings under discussion. These relative terms are for convenience of description and do not require that the present disclosure be constructed or operated in a particular orientation. In addition, terms such as "first" and "second" are used herein for purposes of description and are not intended to indicate or imply relative importance or significance and are not intended to implicitly indicate the number of the technical feature mentioned. Thus, features limited by "first" and "second" are intended to indicate or imply including one or more than one these features. In the description of the present disclosure, "a plurality of" means two or more than two, unless specified otherwise.

In the present disclosure, unless specified or limited otherwise, the terms "mounted," "connected," "coupled" and the like are used broadly, and may be, for example, fixed connections, detachable connections, or integral connections; may also be mechanical or electrical connections; may also be direct connections or indirect connections via intervening structures; may also be inner communications of two elements or interaction relationships between two elements. The above terms can be understood by those skilled in the art according to specific situations.

Reference throughout this specification to "an embodiment," "some embodiments," "one embodiment," "another example," "an example," "a specific examples" or "some examples" means that a particular feature, structure, material, or characteristic described in connection with the embodiment or example is included in at least one embodiment or example of the present disclosure. Thus, the appearances of such phrases in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. An electronic device, comprising:
a housing;
a light-permeable display screen received in the housing and comprising a display area and a black matrix area surrounding the display area, the display area comprising a pixel region configured to display content at lower frequency changes than another region of the display area;
an emitter integrated in the pixel region; and
a receiver arranged between the light-permeable display screen and the housing, and configured to communicate with the emitter;
a buffer layer covering a side of the light-permeable display screen adjacent to the housing, the buffer layer configured to protect the light-permeable display screen from an external impact force; and
a metal sheet covering the buffer layer, the metal sheet configured for shielding against electromagnetic interferences and configured for grounding;
wherein the emitter is configured to emit energy through a first surface of the pixel region of the light-permeable display screen, the first surface being opposite a second surface of the light-permeable display screen and free of a through-hole.

2. The electronic device according to claim 1, wherein the pixel region adjoins the black matrix area.

3. An electronic device, comprising:
a light-permeable display screen having a first surface and a second surface facing away from the first surface, the first surface being free of a through-hole, the second surface comprising a display area and a black matrix area surrounding the display area, the display area comprising a pixel region configured to display content at lower frequency changes than another region of the display area; and
an infrared sensor comprising an emitter integrated in the pixel region and a receiver arranged opposite to one of the display area and the black matrix area, the emitter being configured to emit an infrared light through the first surface, and the receiver being configured to receive the infrared light through the black matrix area;
wherein the black matrix area comprises a window region, the receiver is arranged opposite to the window region, and the receiver is configured to receive the infrared light through the window region;
wherein the electronic device further comprises a coating layer coated at the window region and covering the receiver, the coating layer is configured to allow the infrared light whose wave length ranges from 850 nm to 940 nm to pass therethrough and to block a visible light, and the receiver is configured to receive the infrared light through the coating layer and the window region;
wherein the electronic device further comprises a light-permeable touch panel and a light-permeable cover plate coupled to the light-permeable touch panel, the light-permeable touch panel is coupled to the light-permeable display screen, the first surface faces the light-permeable cover plate, the light-permeable touch panel and the light-permeable cover plate each have a light transmittance for the visible light larger than 90% and a light transmittance for the infrared light larger than 90%.

4. The electronic device according to claim 3, wherein the pixel region adjoins the black matrix area.

5. The electronic device according to claim 3, wherein the infrared sensor comprises a proximity sensor, the proximity sensor comprises a signal emitter and a signal receiver, the signal emitter is configured to emit the infrared light though the first surface, and the signal receiver is configured to receive the infrared light reflected by an object through the one of the display area and the black matrix area so as to detect a distance from the object to the electronic device.

6. The electronic device according to claim 3, wherein the emitter and the receiver are separate.

7. The electronic device according to claim 3, wherein the emitter and the receiver are integral.

8. The electronic device according to claim 3, wherein the coating layer comprises infrared ink, the infrared ink has a light transmittance for the infrared light larger than 85% and a light transmittance for the visible light less than 6%.

9. The electronic device according to claim 3, wherein a ratio of an area of the display area to an area of the light-permeable cover plate is larger than 90%.

10. A manufacturing method for an electronic device, comprising:
providing a light-permeable display screen, the light-permeable display screen comprising a first surface and a second surface facing away from the first surface, the first surface being free of a through-hole, the second surface comprising a display area and a black matrix area surrounding the display area, the display area comprising a pixel region configured to display content at lower frequency changes than another region of the display area; and providing an infrared sensor, the infrared sensor comprising an emitter integrated in the pixel region and a receiver arranged opposite to one of the display area and the black matrix area, the emitter being configured to emit an infrared light through the first surface, and the receiver being configured to receive the infrared light through the one of the display area and the black matrix area, coupling a light-permeable touch panel to the first surface of the light-permeable display screen, the light-permeable touch panel having a light transmittance for the visible light larger than 90% and a light transmittance for the infrared light larger than 90%;

coupling a light-permeable cover plate to the light-permeable touch panel, the light-permeable cover plate having a light transmittance for the visible light larger than 90% and a light transmittance for the infrared light larger than 90%;

providing a window region at the black matrix area, the receiver being arranged opposite to the window region, and the receiver being configured to receive the infrared light through the window region;

coating a coating layer at the window region, the coating layer being configured to allow the infrared light whose wave length ranges from 850 nm to 940 nm to pass therethrough and to block a visible light, and the receiver being configured to receive the infrared light through the coating layer and the window region.

11. The electronic device according to claim 1, wherein the emitter is integrated with a pixel point in the pixel region, or the emitter is integrated and arranged between two adjacent pixel points in the pixel region.

\* \* \* \* \*